United States Patent [19]
Anthony et al.

[11] Patent Number: 5,523,121
[45] Date of Patent: Jun. 4, 1996

[54] SMOOTH SURFACE CVD DIAMOND FILMS AND METHOD FOR PRODUCING SAME

[75] Inventors: Thomas R. Anthony, Schenectady; James F. Fleischer, Scotia, both of N.Y.

[73] Assignee: General Electric Company, Worthington, Ohio

[21] Appl. No.: 220,946

[22] Filed: Mar. 31, 1994

Related U.S. Application Data

[63] Continuation of Ser. No. 897,124, Jun. 11, 1992, abandoned.

[51] Int. Cl.⁶ .................................................. C23C 16/26
[52] U.S. Cl. ...................... 427/249; 427/255.1; 427/122; 427/314; 264/81; 428/408; 423/446; 117/920
[58] Field of Search ................................ 427/249, 255.1, 427/122, 314; 423/446; 428/408; 117/920; 264/81

[56] References Cited

U.S. PATENT DOCUMENTS

| | | |
|---|---|---|
| 4,486,286 | 12/1984 | Lewin et al. . |
| 4,504,519 | 3/1985 | Zelez . |
| 4,645,977 | 2/1987 | Kurokawa et al. . |
| 4,707,384 | 11/1987 | Schachner et al. . |
| 4,925,701 | 5/1990 | Jansen et al. ............................ 427/249 |
| 4,976,324 | 12/1990 | Tibbitts . |
| 5,071,677 | 12/1991 | Patterson et al. ...................... 427/249 |
| 5,169,676 | 12/1992 | Moran et al. ............................ 427/249 |

FOREIGN PATENT DOCUMENTS

| | | |
|---|---|---|
| 0284190 | 9/1988 | European Pat. Off. . |
| 0254312 | 11/1990 | European Pat. Off. . |
| 59-143498 | 8/1984 | Japan . |
| 60-141697 | 7/1985 | Japan . |
| 63-210010 | 8/1988 | Japan . |
| 63-256596 | 2/1989 | Japan . |
| 2-125874 | 5/1990 | Japan . |

OTHER PUBLICATIONS

Bachmann, P. K. et al. "Emerging Technology of Diamond Thin Films" Chemical & Engineering News May 15, 1989 pp. 24–38.

Primary Examiner—Roy V. King

[57] ABSTRACT

Chemical vapor deposition method for producing a fine grained smooth growth surfaced diamond film on a substrate employs a hydrogen/hydrocarbon gaseous atmosphere containing an amount of nitrogen effective to inhibit the growth of the diamond grains deposited on the substrate.

8 Claims, 4 Drawing Sheets

SMOOTH SURFACE CVD DIAMOND FILMS AND METHOD FOR PRODUCING SAME

This is a continuation of application Ser. No. 07/897,124, filed on Jun. 11, 1992, now abandoned.

The present invention relates to diamond films produced by chemical vapor deposition (CVD) and, more particularly, to a CVD method of preparing smooth surfaced diamond film, to the novel structured diamond films thus produced and to structures comprising them.

BACKGROUND OF THE INVENTION

The diamond form of carbon possesses many desirable physical properties such as hardness, chemical inertness, infrared transparency, and excellent heat conductivity coupled with very high electrical resistivity. Consequently, diamond is a material with many important technological applications such as in optical devices, semiconductors, heat sinks, abrasives, tool coating, etc. It can also be used in film form as a high-grade, radiation-resistant, high-temperature semiconductor with obvious applications in many technologies. Thus, there is considerable incentive to find a practical way to produce diamond films by CVD which have a smooth growth surface.

Various methods are known for forming diamond films or coatings. One such method is disclosed in U.S. Pat. No. 4,707,384. Another method is disclosed by E. V. Spitsyn et al., "Vapor Growth of Diamond on Diamond and Other Surfaces", J. of Crystal Growth 52, pp. 219–226 (1981). Additional methods are disclosed in U.S. Pat. Nos. 4,486,286, 4,504,519, 4,645,977 and 4,707,384. One of the methods developed for deposition of synthetic diamond films, viz., the low pressure chemical vapor deposition (CVD) method, has found favor in the literature recently.

One of these techniques involves the use of a dilute mixture of hydrocarbon gas (typically methane) and hydrogen, wherein the hydrocarbon content usually is varied from about 0.1% to 2.5% of the total volumetric flow. The gas is introduced via a quartz tube located just above a hot tungsten filament which is electrically heated to a temperature ranging from between about 1750° C. to 2400° C. The gas mixture disassociates at the filament surface, and diamonds are condensed onto a heated substrate placed just below the hot tungsten filament. The substrate is heated to a temperature in the region of about 500° C. to 1100° C.

The second technique involves the imposition of a plasma discharge to the foregoing filament process. The plasma discharge serves to increase the nucleation density and growth rate and is believed to enhance formation of diamond in the form of a film as opposed to discrete diamond particles. Of the plasma systems that have been utilize in this area, there are three basic systems: one is a microwave plasma system, the second is an RF (inductively or capacitively coupled) plasma system, and the third is a d.c. plasma system. The RF and microwave plasma systems utilize relatively complex and expensive equipment which usually requires complex tuning or matching networks to electrically couple electrical energy to the generated plasma. Additionally, the diamond growth rate offered by these two systems can be quite modest.

A third method in use is direct deposit from acetylene as a hydrocarbon-rich oxyacetylene flame. In this technique, conducted at atmospheric pressure, a specific part of the flame is played on a substrate on which diamond grows at rates as high as 100 microns/hour or more. See Y. Matsui et al., Japan Journal of Applied Physics, 101, 28, p. 178 (1989).

In general, processes for the chemical vapor deposition of diamond involve selection of operating parameters such as the selection of a precursor gas and diluent gases, the mixture proportions of the gases, gas temperature and pressure, the substrate temperature, and means of gas activation. These parameters are adjusted to provide diamond nucleation and growth on a substrate. Mixture proportions and conditions must provide atomic hydrogen to stabilize the surface of the diamond film and preferably minimize the deposition of graphite. Codeposition of graphite is more evident if the hydrocarbon (methane) concentration is increased above about 3%.

The known CVD techniques provide diamond films with a rough chaotic surface typical of a polynucleated crystalline material and exhibit a Raman line at 1332 $cm^{-1}$. However, some of the end-use applications for diamond films, e.g., high velocity water jet, particulate solid abrasive and air nozzle, e.g., for sand blasting, and a particulate solid abrasive and water nozzle require that one or both of the surfaces (faces) of the diamond film be smooth. Although a diamond film only one side of which is smooth can be produced by depositing the diamond film by a CVD process on a polished substrate, and thereafter separating the substrate, e.g., by acid etching, producing a self-supporting diamond film by CVD which is smooth on both sides or a diamond film on a substrate whose growth surface is smooth has not heretofore been accomplished because the active growth surface of a diamond film deposited by CVD in a conventional manner has a rough faceted crystalline surface. As the thickness of a CVD diamond film increases, the crystal size also increases as well as the size of the crystal facets on the growing face. Consequently, the roughness of the growing surface of the diamond film increases as the thickness of the film increases.

Although post-deposit abrasive polishing of the growth surface of a CVD diamond film is theoretically possible, it would be very difficult and prohibitively expensive to do so.

It is desirable to produce thick CVD diamond films with an exposed (growth) surface which is smooth.

OBJECTS OF THE INVENTION

It is an object of the present invention to provide a method for growing CVD diamond film on a substrate wherein the growth surface of the diamond film is smooth.

Another object is to provide a novel polycrystalline form of CVD diamond.

Another object is to provide a composite article of manufacture comprising a substrate with a CVD diamond of this invention in the form of a film on a surface thereof.

An additional object is to provide a novel CVD diamond of this invention in the form of a self-supporting substrate-free film which is smooth surfaced on both sides thereof.

Upon further study of the specification and appended claims, further objects and advantages of this invention will become apparent to those skilled in the art.

SUMMARY OF THE INVENTION

In a method aspect, the present invention relates to a method for producing a diamond film having a smooth growth surface by a chemical vapor deposition (CVD) process in which carbon in the form of a diamond film is deposited onto a surface of a substrate from a hydrocarbon gas mixture under conditions of temperature, pressure, and gas concentration which promote the growth of a diamond coating on the surface of the substrate, which method comprises forming the diamond film from a gaseous mixture containing an amount of nitrogen effective to inhibit the formation and growth of crystal facets in the diamond film.

In a first product aspect, this invention relates to a polycrystalline CVD diamond mass having a grain size of less than 1 micron and which lacks a Raman signature at 1332 cm$^{-1}$; a Raman graphite peaks at 1580 cm$^{-1}$ and sp$^2$ bond Raman broad peak between 1360–1580 cm$^{-1}$.

In a second product aspect, this invention relates to a self-supporting CVD diamond film having a grain size of less than 1 micron, both faces of which are smooth and one face of which is a continuous layer of diamond grains which are bonded together without gaps therebetween and whose exposed surface is rounded.

In a third product aspect, this invention relates to a composite which comprises as an outer layer a CVD diamond film with a grain size of less than 1 micron bonded to a substrate upon which the outer layer of CVD diamond was grown and having a smooth growth surface with at most low tumulus-like rises.

In a fourth product aspect, this invention relates to an article of manufacture having a surface which is exposed in use to abrasive wear, which surface is coated with a fine grained CVD diamond film according to this invention.

BRIEF DESCRIPTION OF THE DRAWINGS

Various other objects, features and attendant advantages of the present invention will be more fully appreciated as the same becomes better understood when considered in conjunction with the accompanying drawings, in which like reference characters designate the same or similar parts throughout the several views, and wherein.

DETAILED DESCRIPTION

In contrast to the growth surface of a conventionally produced CVD diamond, which is rough, angular and faceted, the growth surface of a diamond film of this invention is much smoother, with at most low gentle tumulus-like rises in the plane thereof. Whereas the grain size or crystal size on the growth surface of the normal CVD diamond film is about 100–150 microns, the diamond films of this invention have a grain (crystal) size, both on the growth surface and internally, of less than 1 micron.

The reason for this difference is the grain size on the surface of a conventionally grown CVD diamond film is proportional to the thickness of the diamond film, because once the diamond starts growing on and covers the substrate surface, nucleation of new diamond grains cease. At this point, only the old diamond grains that were previously nucleated continue to grow. The increasing surface grain size with increasing film thickness is the result of competitive growth between competing crystals. Thus, whereas the grain size on the substrate surface initially is approximately 1 micron, as the film grows thicker, certain favorably oriented grains grow faster than their neighbors and overgrow them. Fewer and fewer grains survive as the films becomes thicker, with the result the surviving grains become larger since they grow both laterally and vertically.

In the process of this invention, an increasing grain size with increasing film thickness does not occur. Instead, there appears to be a continuous nucleation of new diamond grains that cover up the old diamond grains so that no grain has a chance to increase in size. Thus, the grain size is independent and constant through the thickness of the resulting diamond film.

Figure 1:
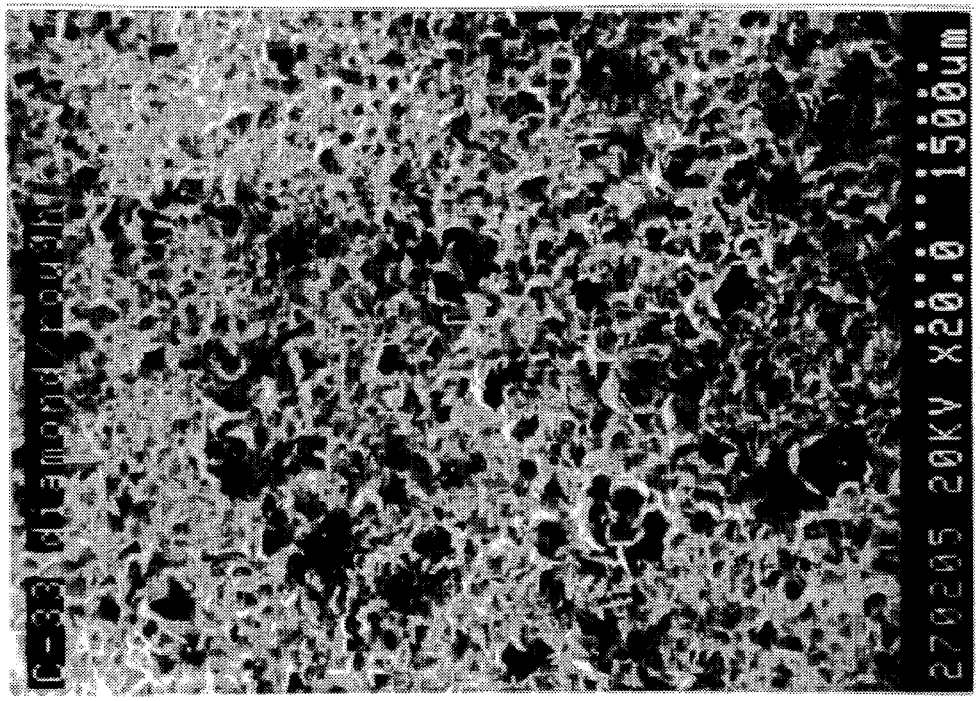
FIG. 1 is a microphotograph of the surface of a conventionally produced diamond film at 20X magnification.
Figure 2:
FIG. 2 is a microphotograph of the surface of the conventionally produced diamond film shown in FIG. 1 at 200X magnification.
Figure 3:
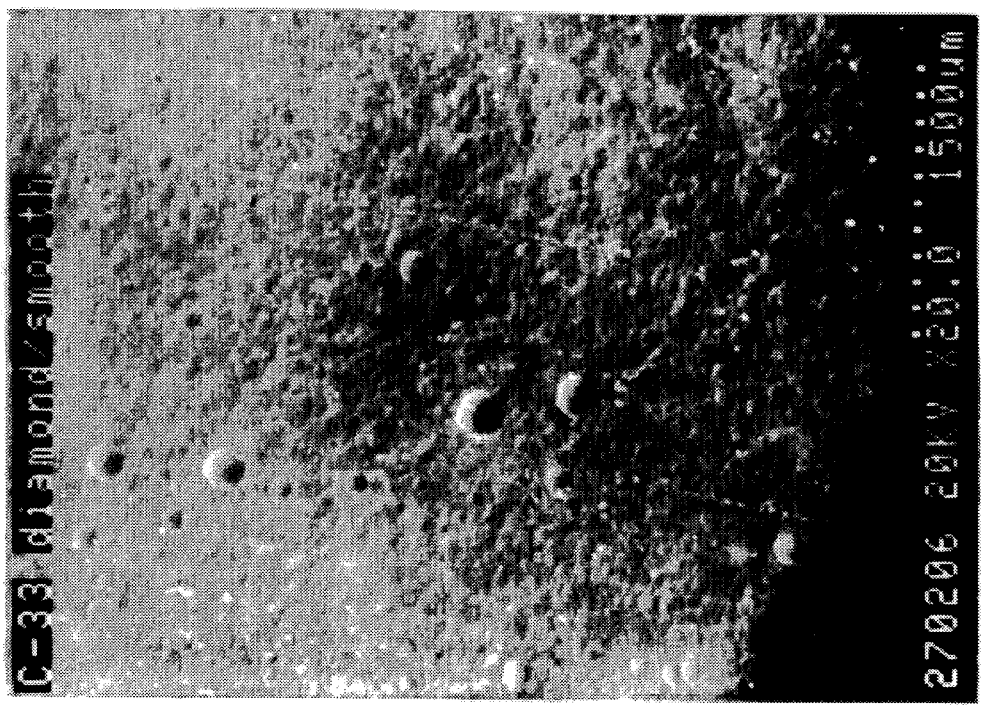
FIG. 3 is a microphotograph of the surface of a smooth surfaced diamond film of this invention at 20X magnification.
Figure 4:
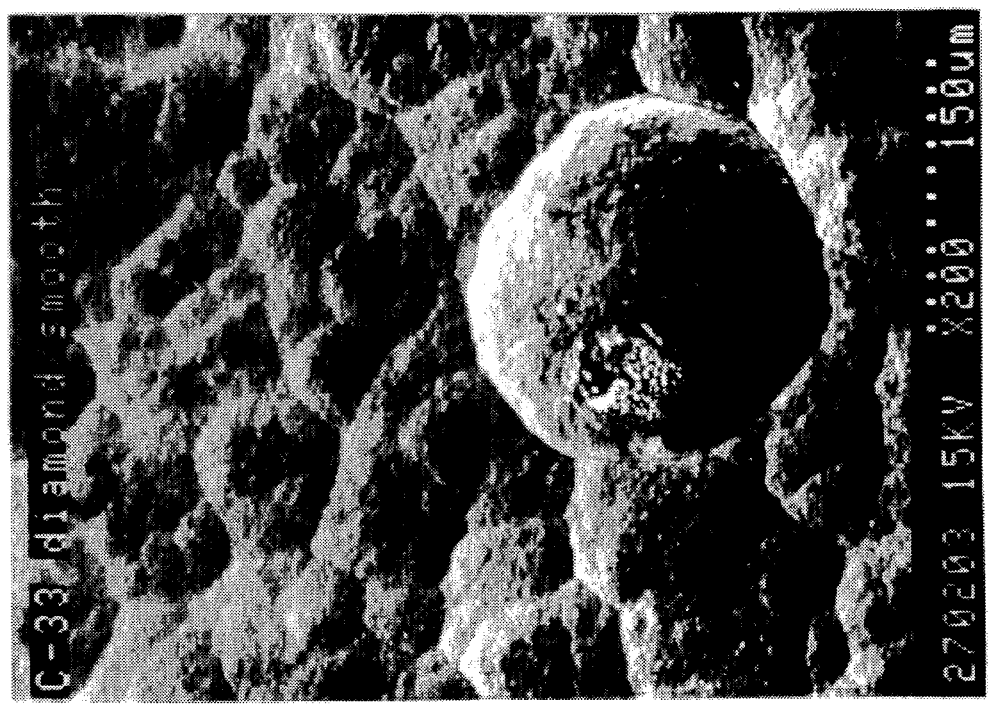
FIG. 4 is a microphotograph of the surface of the smooth surfaced diamond film of this invention shown in FIG. 3 at 200X magnification.
Figure 5:
FIG. 5 is a microphotograph of the surface of a polished cross-section of the diamond film of FIGS. 1 and 2 at 200X magnification.

As can be seen from FIGS. 3 and 4, the growth surface of the diamond films of this invention is smooth, i.e., its surface varies (except for an occasional individual diamond grain embedded in the surface) in height less than about 2% and preferably less than 1%. The grains vary in size less than about 30% and usually less than 10% from the average size of the diamond grains forming the film, which grains average less than 1 micron in diameter, i.e., they average from about 0.05 to 0.7 μm, and in preferred embodiments about 0.1 to 0.3 μm.

The substrate side of the diamond film will, of course, be a mirror image of the surface of the substrate on which it was grown, which in the case of the self-supporting (substrate-free) diamond films of this invention is also smooth, i.e., it varies less than 1%, preferably less than 0.1%, when polished to a mirror smooth surface, it lacks the voids and irregularities resulting from crystal pullout during the polishing process.

Because the grain size of the diamond films of this invention is so uniformly small, if the substrate surface upon which the diamond film is grown has a pattern etched on it, e.g., a microcircuit, a raised mirror image thereof will form on the face of the diamond film formed thereon, which image becomes exposed when the substrate is removed, e.g., by etching with acid. Also, because of the smallness and uniformity of the grains, a surface thereof can more easily be polished to a mirror smooth surface without flaws therein because the grains embedded within the surface of the film resist being dislodged therefrom during the polishing process.

Thus, the grain (facet) size of the novel diamond films of this invention is remarkably uniform throughout and typically is less than 1 micron. It is so small because unlike conventionally produced CVD diamond films, whose crystal size increases as the thickness of the film increases, the initially deposited grains do not act as growth surfaces for the diamond carbon subsequently deposited thereon. Instead, the formation of each new grain is substantially unaffected by the size of the prior deposited grains, so that a homogeneous film is produced, irrespective of the thickness thereof. As a result, these smooth fine-grain diamond films do not have Raman signature at 1332 cm$^{-1}$. Raman spectra also show that the nitrogen does not cause a noticeable increase in graphite codeposition or sp$^2$ bonding.

Figure 6:
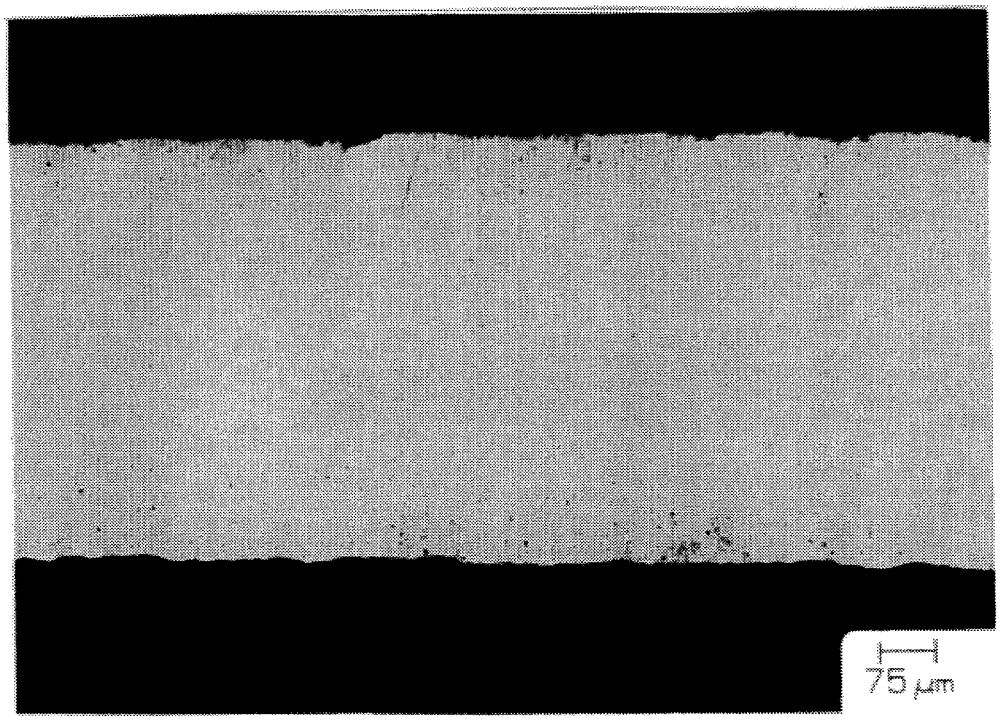
FIG. 6 is a microphotograph of the surface of a polished cross-section of a diamond film of FIGS. 3 and 4 at 200X magnification.
Figure 7:
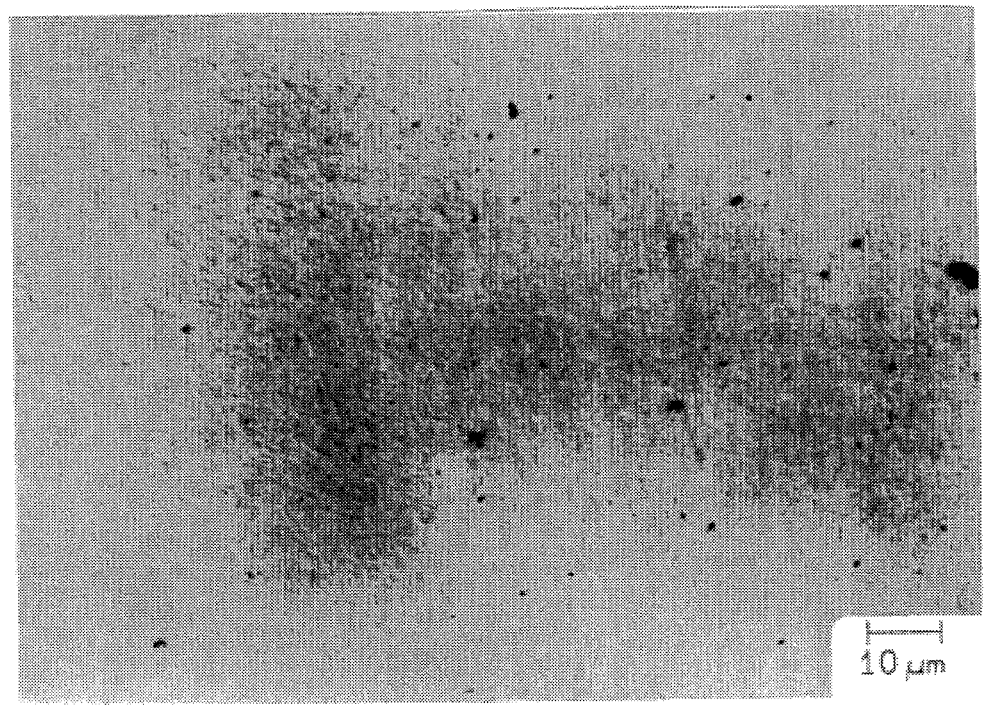
FIG. 7 is a microphotograph of the surface of a polished cross-section of a diamond film of FIG. 6 at 1200X magnification.

This is apparent from FIGS. 6 and 7, which shows the polished cross-section of a diamond film which is about 0.5 mm thick, which presents a totally homogeneous appearance both at 200X and at 1200X magnifications. Unlike conventional CVD methods, in the process of this invention, all of the conventional substrates generate a high density of diamond nuclei without having been roughened or subjected to abrasion with diamond dust.

Any conventional substrate material suitable for the deposition of CVD diamond thereon may be employed as the substrate utilized in the present invention. The substrate material can be a metal, a metal carbide, a metal nitride, a ceramic, etc., e.g. silicon carbide, tungsten carbide, molybdenum, boron, boron nitride, niobium, graphite, copper, aluminum nitride, silver, iron, steel, nickel, silicon, alumina, and silica, as well as combinations thereof.

In one aspect of this invention, the diamond film separates spontaneously from the substrate on cooling from the deposition temperature where the substrate, e.g., molybdenum, has a thermal coefficient of expansion which is significantly different from the diamond film deposited thereon. The substrate can also be removed from the diamond coatings by conventional methods, such as acid leaching, thus providing self-supported diamond films. The substrate desirably is of a thickness less than the diamond coatings formed thereon, typically less than either coating formed thereon. These substrates range in thickness from 0.15 to 1.27 cm and are typically about 0.32 cm in thickness.

In another aspect of this invention, the novel CVD diamond form of this invention is deposited as a film on the surface of an article of manufacture which is subjected in use to abrasive wear. The broad concept of applying a diamond to such a surface of an article already exists in the prior art, since the hardness of a diamond inherently makes it more wear resistant. The CVD diamond films created by the method of this invention are surprisingly superior in this end-use environment because they lack the surface flaws normally present, e.g., cracks created by ingrown stresses, random grain size and voids created by diamond grain pull out when the surface is polished.

An example of an article of manufacture having a surface which is subject to severe abrasion wear is a steel water jet mixing tube comprising a funnel, into which abrasive particles are supplied, surrounding coaxially a water jet which ejects at high pressure a jet of water axially down a mixing tube affixed to the funnel as a neck thereof. The interior surface of the mixing tube is coated with a diamond film of this invention.

Another example of such an article of manufacture is a free jet steel nozzle for directing a jet of water at a high pressure therethrough. To produce a symmetric stable jet stream that can travel 6" before it breaks up as a result of Rayleigh instability, the interior circular peripheral edge of the nozzle, around which the stream of water passes under high pressure as it is shaped into a precisely defined jet stream, must have sharply curved surface, e.g., 1–3 microns, an included angle within 3° of a right angle, and must not be out of round more than 0.2%. By coating at least this peripheral edge of the nozzle with a CVD diamond film of this invention, a highly wear resistant nozzle meeting these criteria can readily be produced.

The thickness of the diamond films produced range from about 5–2000 μm and, because films with smooth growth surfaces become more difficult to produce conventionally as the thickness thereof increases, the self-supporting films are preferably 50 to 2000 μm, preferably 150 to 1000 μm. The films on the composites generally range in thickness from about 5 to about 500 μm.

Except for the nitrogen therein, conventional reactive gas mixtures and process conditions are suitable for use in the process of this invention. For example, gaseous hydrogen and hydrocarbon mixtures, e.g., containing from 0.1 vol. % to 10.0 vol. %, preferably from 0.5 vol. % to 2.0 vol. % Of the hydrocarbon and from 0.1 vol. % to 10.0 vol. %, preferably 0.5 vol. % to 7.0 vol. % of nitrogen, with the remaining 90 vol % to 99.8 vol. %, e.g., 91–99.5%, hydrogen are suitable. The hydrocarbon sources can include alkane series gases such as, for example, methane, ethane, and propane; unsaturated hydrocarbons, for example, ethylene, acetylene, cyclohexene, benzene and the like. Methane, however, is preferred. The molar ratio of hydrocarbon to hydrogen broadly ranges from about 1:10 to about 1:1000, with about 1:200 to 3:200 being preferred.

The reactive gas mixture employed in this invention contain an amount of nitrogen effective to inhibit diamond growth on the diamond grains deposited on the substrate. Typically, only a small amount of nitrogen therein is required, e.g., up to about 10 vol. %, preferably about 0.5 to about 7.0 vol. %. Good results are achieved, with gas mixtures containing about 4–6 vol. % nitrogen. It is particularly advantageous to utilize nitrogen concentrations which provide for growth of diamond films having a grain size of less than 1 micron.

Another beneficial effect of the presence of nitrogen in the reactive gas mixture is that it keeps the walls of the reaction chamber clean during the diamond growth run. Normally, some deposits form on the walls of a quartz tube chamber during a long run and must be cleaned off after a number of runs or the tube becomes opaque.

Contemplated equivalents of the method of this invention are those wherein a portion or all of the nitrogen is replaced by a functionally equivalent gas, e.g., ammonia or hydrogen cyanide.

The reactive gas mixture may optionally also be diluted with an inert gas, such as argon, neon, xenon and/or helium.

Pressures for the reactive gas mixture generally range from about 0.01 to 1000 Torr, advantageously about 1 to 760 Torr, and preferably about 10 Torr. Details on conventional process conditions suitable for use suitable for use herein can also be found in Angus et al., "Low Pressure Metastable Growth of Diamond and Diamond-Like Phases" Science Vol. 241, pp 913–921 (Aug. 19, 1988), and Bachman et al., "Thin Diamond Films", Chemical , Engineering News, pp. 24–39 (May 15, 1989). U.S. Pat. No. 4,707,384 provides further details concerning CVD conditions and techniques.

The reactive gas mixture of hydrogen, nitrogen and a hydrocarbon, most often methane, is preferably "energized" or excited utilizing conventional techniques, preferably by passing the reactive gas over a hot filament at a conventional temperature, preferably in the range of 1700°–2400° C. Once energized, the excited reactive gas mixture is contacted with the surface of the substrate to be coated with a diamond film.

The substrate is desirably heated to a conventional temperature. The substrate temperature utilized for diamond growth typically ranges from about 500°–1100° C. and is preferably in the range of 850°–950° C. It is often desirable to maintain the substrate at temperatures in the range of about 900°–1000° C. since, within this range, minimum reaction occurs between the hydrogen present in the gas mixture and the elemental carbon formed from the hydrocarbon therein. Thus, the elemental carbon remains available to deposit as diamond at a high growth rate on the substrate. Absent any provisions for independently controlling substrate temperature, the temperature can exceed 1000° C., and the diamond growth rate decreases substantially. Growth rates in the range of about 0.1 to 10 μm per hour have been easily obtained at energy requirements of about 650 watts/hour. Growth rates greater than 10 μm/hour can be obtained at higher energy costs.

The substrate employed in the process of this invention typically has a thickness in the range of 0.05 to 2.54 cm, preferably about 0.15 to 0.65 cm. The surface area of the substrate can vary widely, e.g., from 0.65 cm$^2$ to 16,000 cm$^2$. One or both sides of the substrate are adapted to be exposed to heat and to a reactive gas mixture so as to grow diamond thereon. The surface on which the diamond film is preferably polished so as to allow easy removal of the diamond film formed thereon to provide self-supporting films. Suitable materials are those described above.

Apparatus suitable for performing the process of this invention utilizes a substrate as described above. This apparatus comprises a reaction chamber which is airtight and capable of being maintained under reduced pressure. It is fitted with at least one inlet into which a stream of a reaction gas mixture is fed and an exhaust means is provided to withdraw a stream of the spent reaction gas mixture. All portions of the reaction chamber can be of a conventional design and construction. Quartz is illustrative of a suitable non-conductive, heat-resistant material of which to form the chamber.

A substrate employed in this invention is positioned in the reaction chamber by a support means, which can be a spring tension mechanism which maintains the substrate rigidly positioned.

The apparatus can also comprise a heating means for heating the growth side of the substrate which preferably is an electrode and a vertically extending, linear, electrically conductive filament or wire (hereinafter generically designated "filaments") of otherwise conventional design and circuitry. The material of which the filament is formed is not critical, any material known in the art as suitable for this purpose being acceptable. Illustrative materials are metallic tungsten, tantalum, molybdenum, and rhenium which can be heated to temperatures between 1700°–2400° C. Because of its relatively low cost and particular suitability, tungsten is often preferred. Filament diameters of about 0.017–1 cm are typical, with about 0.076 cm frequently being preferred.

The filament (or filaments) is positioned on the growth side of and parallel to the substrate. The distance from the filament to substrate generally is of the order of about 0.2–2 cm. When more than one filament is employed, they are preferably separated by a spacing equal to the filament-to-substrate spacing from each other. A radiation shield, preferably about 7.6 cm in diameter, may be placed around the substrate/filament arrangement. Since a plurality of filaments, preferably two on each side of the substrate surface to be coated with a diamond film, and associated structures can be employed, it is to be understood that the total number thereof is not critical.

The apparatus also includes means for contacting the side or sides of the substrate to be coated with the reactive gas mixture. This may not require an additional structure or element if the substrate is positioned appropriately within the reaction chamber.

The composites of this invention comprise a smooth surfaced diamond film covering at least one surface of the substrate upon which the diamond film was grown. The composite is of a length and width consistent with conventional substrates, typically ranging from about 0.1 to 2500 square inches. The thickness of the diamond film ranges from 1–2000 μm, preferably 150–1000 μm. A substrate intended to be separated later typically has a thickness of from 0.01 to 0.5 cm, preferably about 0.025 to 0.1 cm.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever.

In the foregoing and in the following example, all temperatures are set forth in degrees Celsius; and, unless otherwise indicated, all parts and percentages are by weight.

The entire disclosure of all applications, patents, and publications, cited above and below, are hereby incorporated by reference.

EXAMPLE

A CVD reactor, designed to accept the substrate described below, is used. The CVD reactor comprises a quartz reaction chamber, a gas inlet, and an exhaust outlet. The substrate is a 3.2×28 cm strip of molybdenum of 0.32 cm thickness. The substrate is exposed to a 0.076 cm diameter 218 tungsten filament positioned at a distance of about 7 mm from the surface of the substrate.

The chamber is evacuated and the filament heated to bright white heat (about 2000° C.) heating the surface of the substrate to a temperature of from 800°–1000° C. A reactive gas mixture consisting of about 1.3 vol. % methane, 5 vol. % nitrogen and 93.3 vol. % hydrogen is introduced into the chamber at 11 Torr at a flow rate of 300 cm/min. Passage of the gas mixture and heating of the substrate is continued for 54 days, which results in a diamond growing on the surface of the substrate facing the filament. At the end of this time, the gaseous flow is stopped, and the system is cooled down. A composite in the form of a diamond film as shown in FIGS. 3, 4, 6 and 7 on a face of the molybdenum substrate is removed. The thickness of each diamond coating is about 425 microns. The diamond film separates as an integral diamond sheet on cooling. Raman spectra of sample diamond coating shows no signature line at 1332 cm$^{-1}$ and no graphite peak. X-ray diffraction of the same film shows the film comprises cubic diamond. SIMs analysis shows the film contains some nitrogen. The free-standing film has an electrical resistivity of $10^{10}$ ohm-cm measured at an electric field intensity of 10,000 volts/cm.

The preceding example can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. A method for producing a fine grained diamond film by a chemical vapor deposition (CVD) process comprising depositing a diamond film onto a smooth surface of a heated substrate wherein a diamond growth surface is exposed to a flowing hydrogen and hydrocarbon gas mixture, a hot filament in the path of said flowing gas mixture, said depositing being carried out by passing said gas mixture over at least one filament, said filament being at a temperature between about 1700 to about 2400 degrees Centigrade and being substantially parallel to said surface a distance of about 0.2 to 2 centimeters from said surface, said depositing said diamond film being carried out under conditions of temperature, pressure, and gas concentration which promote the growth of a diamond coating on the surface of the substrate, said substrate temperature being maintained between about 850 to 950 degrees Centigrade, hydrocarbon content being within the range of 0.1 to 2.5 percent of the total volume of said gas mixture, and nitrogen content being selected within a range from about 4 to about 6 volume percent of the total volume for inhibiting the formation and growth of crystal facets in the diamond film whereby said diamond film is deposited uniformly into a single layer having a grain size of less than 1 micron, a Raman graphite peak at 1580 $cm^{-1}$ and a $sp^2$ bond Raman broad peak between 1360-15 $cm^{-1}$, said single layer having no Raman signature at 1332 $cm^{-1}$ wherein the final growth surface of which is a smooth continuous layer of diamond grains having an average size of less than 1 micron which are bonded together without gaps there-between and whose exposed surfaces are rounded, said single layer of polycrystalline diamond has no Raman signature at 1332 $cm^{-1}$.

2. A method as in claim 1, wherein the hydrocarbon is methane.

3. A method according to claim 2, wherein the concentration of hydrogen and methane is about 90 to about 99.5 vol. %, respectively.

4. A method according to claim 1, wherein the nitrogen content is about 5 vol. %.

5. A method according to claim 1, wherein the surface of the substrate on which the diamond film is deposited is polished.

6. A method for producing a fine-grained CVD diamond film according to claim 1 comprising removing said diamond film from said substrate.

7. A method for producing a fine-grained CVD diamond film according to claim 6 wherein said substrate has a different coefficient of expansion than that of said diamond film, and said substrate and said deposited diamond film are cooled to separate said substrate from said diamond film.

8. A method for producing a fine-grained CVD diamond film according to claim 1 wherein said filament comprises tungsten and has a diameter of about 0.017 to one centimeter.

* * * * *